United States Patent
Yu et al.

(10) Patent No.: US 11,682,350 B2
(45) Date of Patent: Jun. 20, 2023

(54) ELECTROLUMINESCENT DISPLAY PANEL HAVING THE EMISSION DRIVING CIRCUIT

(71) Applicant: LG Display Co., Ltd., Seoul (KR)

(72) Inventors: Jaesung Yu, Seoul (KR); Jungsoo Park, Goyang-si (KR); Sewan Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/674,790

(22) Filed: Feb. 17, 2022

(65) Prior Publication Data

US 2022/0172680 A1    Jun. 2, 2022

Related U.S. Application Data

(63) Continuation of application No. 17/094,395, filed on Nov. 10, 2020, now Pat. No. 11,282,454.

(30) Foreign Application Priority Data

Nov. 11, 2019   (KR) .................. 10-2019-0143595

(51) Int. Cl.
   *G09G 3/3233* (2016.01)
   *G09G 3/3275* (2016.01)
   *G09G 3/3266* (2016.01)

(52) U.S. Cl.
   CPC ......... *G09G 3/3233* (2013.01); *G09G 3/3266* (2013.01); *G09G 3/3275* (2013.01); *G09G 2300/0452* (2013.01); *G09G 2300/0842* (2013.01); *G09G 2300/0861* (2013.01); *G09G 2310/0286* (2013.01); *G09G 2310/08* (2013.01); *G09G 2320/0233* (2013.01)

(58) Field of Classification Search
   None
   See application file for complete search history.

(56) References Cited

U.S. PATENT DOCUMENTS

| 8,674,905 B2 * | 3/2014 | Eom ............... G09G 3/3233 345/98 |
| 2005/0104817 A1 | 5/2005 | Kwak |
| 2005/0104875 A1 | 5/2005 | Kwak et al. |
| 2005/0259095 A1 | 11/2005 | Kwak |
| 2005/0264496 A1 * | 12/2005 | Shin ............... G09G 3/3233 345/76 |
| 2013/0100007 A1 * | 4/2013 | Yamamoto ....... G09G 3/36 377/64 |

(Continued)

FOREIGN PATENT DOCUMENTS

KR   10-2019-0024465 A    3/2019

*Primary Examiner* — Dorothy Harris
(74) *Attorney, Agent, or Firm* — Seed IP Law Group LLP

(57) ABSTRACT

According to one exemplary embodiment of the present disclosure, the electroluminescent display panel may include a plurality of pixels arranged along a row direction and a column direction, an emission line transmitting an emission signal to the plurality of pixels arranged along the row direction and an emission driving circuit providing an emission signal to the plurality of pixels. The emission driving circuit includes a plurality of emission stages wherein the number of emission stages is more than the number of the plurality of pixels arranged along the column direction. Therefore, the pulse width resolution of the display panel may be enhanced and the low gradation stain may be reduced.

17 Claims, 13 Drawing Sheets

(56) References Cited

U.S. PATENT DOCUMENTS

| | | | | |
|---|---|---|---|---|
| 2016/0210892 A1* | 7/2016 | Ohara | .................. | G09G 3/3266 |
| 2016/0379558 A1* | 12/2016 | Jeon | ..................... | G09G 3/3225 |
| | | | | 345/213 |
| 2017/0223307 A1* | 8/2017 | Ono | ......................... | H04N 5/06 |
| 2018/0277610 A1* | 9/2018 | Kubota | ............... | H01L 27/3272 |

* cited by examiner

ELECTROLUMINESCENT DISPLAY PANEL HAVING THE EMISSION DRIVING CIRCUIT

CROSS-REFERENCE TO RELATED APPLICATION

This application is a continuation of U.S. patent application Ser. No. 17/094,395, filed Nov. 10, 2020 which claims the benefit of Korean Patent Application No. 10-2019-0143595, filed on Nov. 11, 2019, which is hereby incorporated by reference as if fully set forth herein.

BACKGROUND

Technical Field

The present disclosure relates to an electroluminescent display panel including an emission driving circuit having an enhanced display grade of low gradation.

Description of Related Art

As information technology has been developed, a market of a display device which is a connecting medium between a user and information has been grown. Beyond information delivery among users based on a text, communication through a video is active. Meanwhile, as the market of the display device in a life has been expanded, a brief display of necessary information is needed. In this case, the display device having low resolution is used to rationalize a price. A spec of the display device is fluid according to a type of information. The display device may be used in various types such as an electroluminescent display device, a liquid crystal display device, and a quantum dot display device, etc.

BRIEF SUMMARY

The display device includes a display panel including a plurality pixels, a driving circuit providing a signal for driving the display panel, and a power supply providing power to the display panel etc. The driving circuit includes a gate driving circuit providing a gate signal to the display panel and a data driving circuit providing a data signal to the display panel etc.

Based on signals including a gate signal and a data signal provided to a plurality of pixels in the electroluminescent display panel, a light emitting diode in each of selected pixels in the plurality of pixels emits light. Accordingly, the electroluminescent display panel may display an image. The light emitting diode may be realized based on an organic matter or an inorganic matter.

The electroluminescent display panel includes an emission driving circuit for controlling light emitting of the light emitting diode wherein in order that the emission driving circuit outputs an emission signal, an emission clock signal is applied to the emission driving circuit. The emission signal includes a gate on signal for turning on an emission transistor according to a regular cycle. In this case, the period in that the emission signal is the gate on signal may be referred to as a pulse width of the emission signal, and based on the pulse width of the emission signal, time in that the light emitting diode emits light is controlled. A cycle of the emission clock signal may determine the pulse width resolution of the emission signal. The pulse width resolution represents a degree which may precisely control light emitting time of the light emitting diode. In the case of a low resolution display panel of which resolution is low, a problem with the pulse width resolution may occur and thus a low gradation stain may occur.

The present disclosure is directed to the electroluminescent display panel which may enhance a display grade of low gradation.

In one or more embodiments, the present disclosure provides an electroluminescent display panel including an emission driving circuit realized to precisely control light emitting time of the light emitting diode.

In one or more embodiments, the present disclosure provides an electroluminescent display panel including an emission driving circuit realized to enhance the pulse width resolution.

Additional advantages, objects, and features of the disclosure will be set forth in part in the description which follows and in part will become apparent to those having ordinary skill in the art upon examination of the following or may be learned from practice of the disclosure.

According to one or more embodiments of the present disclosure, the electroluminescent display panel may include a plurality of pixels arranged along a row direction and a column direction, an emission line transmitting an emission signal to the plurality of pixels that are arranged along the row direction, and an emission driving circuit providing the emission signal to the plurality of pixels. The emission driving circuit includes a plurality of emission stages wherein the number of the plurality of emission stages is greater than the number of the plurality of pixels arranged along the column direction. Therefore, the pulse width resolution of the display panel may be enhanced and the low gradation stain may be reduced.

According to one or more embodiments of the present disclosure, the electroluminescent display panel includes a pixel array made of a pixel column and a pixel row, a controller, and an emission driving circuit including a plurality of the emission stages. The controller may provide a control signal controlling the emission driving circuit and the pixel array includes a plurality of pixels. Each of the plurality of pixels includes the light emitting diode, a driving transistor providing a driving current to the light emitting diode, and the emission transistor controlling the driving current that is applied to the light emitting diode.

The emission transistor may be controlled by the emission signal provided from the emission driving circuit. The emission signal occurs based on the emission clock signal provided from the controller and includes a gate on pulse and a gate off pulse which are repeated at least once in one vertical period, and a cycle of the emission clock signal is smaller than (one frame period-a blank period of a vertical period)/the number of pixels included in the pixel column. Therefore, the pulse width resolution of the display panel is enhanced and the stain of low gradation may be reduced.

Specific matters of other embodiments are included in the detailed description of the invention and drawings.

According to one or more embodiments of the present disclosure, the number of emission stages included in the emission driving circuit is configured to be more than the number of pixels arranged in the column direction, so that a cycle of the emission clock signal and the pulse width of the emission signal are reduced. Accordingly, the pulse width resolution of the display panel is increased and the low gradation stain of the display panel may be reduced.

DETAILED DESCRIPTION

Figure 1:
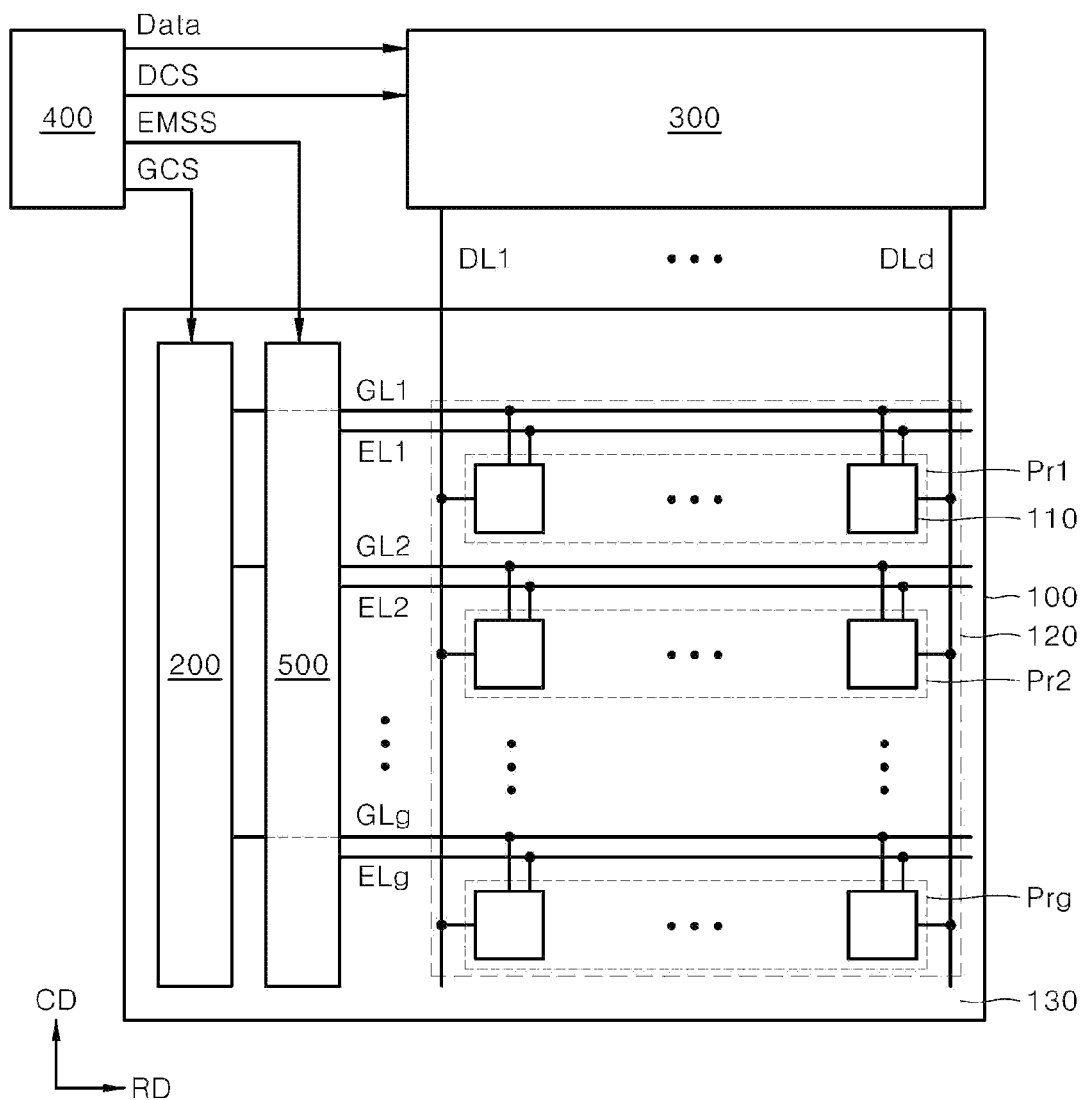
FIG. 1 is a block diagram of the electroluminescent display device according to one or more embodiments of the present disclosure.

Advantages and features of the present disclosure, and a method of achieving the above will be clarified referring to an exemplary embodiment. However, the present disclosure is not limited to exemplary embodiments disclosed hereinafter but is realized in different and various forms. The exemplary embodiments are merely provided to complete the present disclosure and to inform those skilled in the art of the making and using the invention completely. The scope of protection provided by the present disclosure is defined only by the claims.

A shape, a size, a ratio, an angle, and the number disclosed in drawings for explaining an embodiment of the present disclosure are provided only as examples, so that the invention is not limited by the disclosed matter. Throughout the drawings, identical reference numerals denote identical components. Also, in describing the disclosure, detailed description of known technology in relation to the disclosure is omitted if it is deemed to make the gist of the present disclosure unnecessarily vague. When "comprise," "have," and "compose" noted in the present disclosure is used, other parts may be added as long as "only" is not used. In case of components are described as the singular, the case of including the plural is included as long as there is not a definite described matter particularly.

When interpreting a component, it may be understood that an error range is included even though there is no additional definite description.

In case of describing a positioning relation, if the positioning relation of two parts is described such as, for example, "on," "upper," "lower," and "beside", one or more other parts may be positioned between two parts as long as "right" or "direct" is not used.

In case of describing a time relation, if a before-and-after relation of time is described such as, for example, "after," "following," "next," and "before", a discontinuous case may be included as long as "right" or "directly" is not used.

Each of features of various exemplary embodiments of the present disclosure may be partially or entirely coupled or combined with one another, various interlocking and driving are technically available, and each of embodiments may be independently implemented with respect to one another and may be implemented together in a connection relation.

Hereinafter, referring to the attached drawings, an electroluminescent display device including an emission driving circuit according to one or more embodiments of the present disclosure is described.

Figure 2:
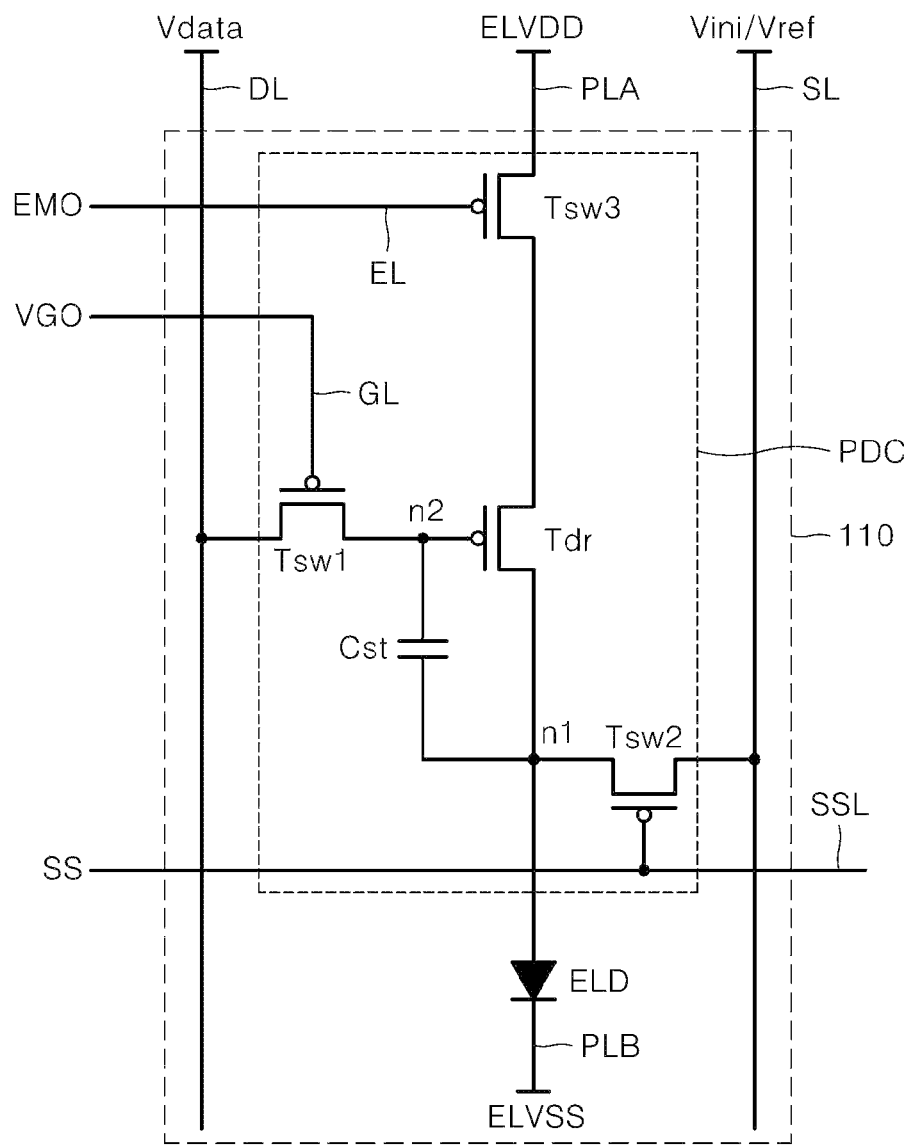
FIG. 2 is a circuit diagram illustrating an electrical connection relation of components configuring one sub-pixel according to one or more embodiments of the present disclosure.
Figure 3:
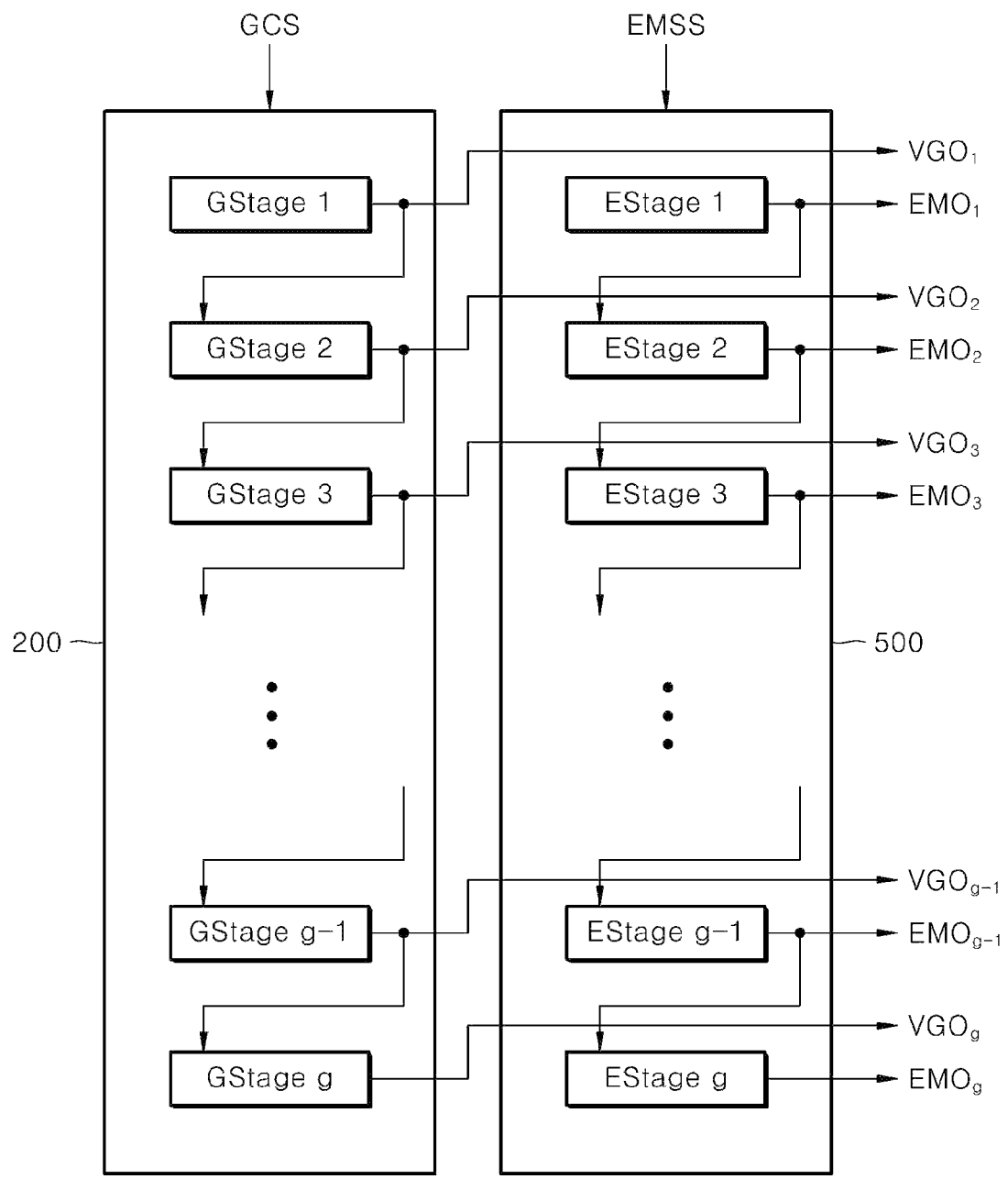
FIG. 3 is a figure representing a structure of a signal transmission between a gate driving circuit and an emission driving circuit according to one or more embodiments of the present disclosure.

FIG. 1 is a block diagram of the electroluminescent display device according to one or more embodiments of the present disclosure. FIG. 2 is a circuit diagram describing an electrical connection relation of components configuring one sub-pixel. FIG. 3 is a figure representing a structure of a signal transmission between a gate driving circuit 200 and an emission driving circuit 500.

Referring to FIGS. 1 and 2, the electroluminescent display device may include a display panel 100, a gate driving circuit 200, a data driving circuit 300, a controller 400, and an emission driving circuit 500.

The display panel 100 may be divided into a display region 120 having a pixel array and a non-display region 130 that is a region other than the display region 120.

The display panel 100 includes gate lines (GL1 to GLg) and data lines (DL1 to DLd), pixels 110, a gate driving circuit 200, and an emission driving circuit 500. Each of the pixels 110 includes sub-pixels and each of sub-pixels includes a light emitting diode (ELD) and an emission transistor (Tsw3) controlling timing in that the light emitting diode (ELD) emits light.

Referring to FIG. 2, each of sub-pixels includes the light emitting diode (ELD) and a pixel driving circuit (PDC).

Signal lines (DL, EL, GL, PLA, PLB, SL, SSL) providing a driving signal to a pixel driving circuit (PDC) are disposed at each of sub-pixels.

A data line (DL) receives a data voltage (Vdata) from a data driving circuit 300 and a gate line (GL) receives a gate signal (VGO) from the gate driving circuit 200. The data driving circuit 300 or the controller 400 provides a first driving voltage (ELVDD) to a first driving voltage providing line (PLA), provides a second driving voltage (ELVSS) to a second driving voltage providing line (PLB), and provides an initialization voltage (Vini) or a sensing voltage (Vref) to a sensing line (SL). A sensing control signal (SS) is provided from the gate driving circuit 200 to a sensing signal line (SSL) to turn on a sensing transistor (Tsw2). An emission signal (EMO) is provided from an emission driving circuit 500 to an emission line (EL) to turn on an emission transistor (Tsw3).

A display panel 100 includes a plurality of emission lines (EL1 to ELg) and emission lines (EL1 to ELg) are connected to pixels 110 arranged in a row direction (RD) together with gate lines (GL1 to GLg), and the emission signal (EMO) outputted from each of emission lines (EL1 to ELg) is provided to the pixels 110. The emission transistor (Tsw3) is turned on or turned off by the emission signal (EMO).

The pixel driving circuit (PDC) includes four transistors (Tdr, Tsw1, Tsw2, Tsw3) and one capacitor (Cst). Components of the pixel driving circuit (PDC) are not limited thereto, and various pixel driving circuits including a driving transistor and an emission transistor may be also applied. Also, each of the transistors included in a pixel driving circuit (PDC) according to one or more embodiments of the present disclosure is configured as PMOS which is described as an example but may be configured as NMOS.

The driving transistor (Tdr) controls an amount of a current flowing to a light emitting diode (ELD). A drain electrode of the driving transistor (Tdr) is connected to a first node (n1) and an anode of the light emitting diode (ELD), and a gate electrode of the driving transistor (Tdr) is connected to a second node (n2).

The switching transistor (Tsw1) is connected to the gate line (GL), the data line (DL), and the second node (n2), is turned on by a gate signal (VGO), and provides the data voltage (Vdata) to a gate and a second node (n2) of the driving transistor (Tdr).

The sensing transistor (Tsw2) is connected to the sensing signal line (SSL), the sensing line (SL), and the first node (n1). The sensing transistor (Tsw2) provides an initialization voltage (Vini) to the anode of the light emitting diode (ELD) based on the sensing control signal (SS) and is turned on by the sensing control signal (SS) to sense characteristics of the driving transistor (Tdr). In a process of sensing characteristics of the driving transistor (Tdr), a sensing voltage (Vref) is used. The initialization voltage (Vini) and the sensing voltage (Vref) are provided to the sensing line (SL) in a different period.

The gate electrode of the emission transistor (Tsw3) is connected to the emission line (EL), and the emission transistor (Tsw3) is connected to the first driving voltage providing line (PLA) and a source electrode of the driving transistor (Tdr). The emission transistor (Tsw3) is turned on by the emission signal (EMO) to transmit the first driving voltage (ELVDD) to the driving transistor (Tdr) or is turned off by the emission signal (EMO) to prevent that the first driving voltage (ELVDD) is transmitted to the driving transistor (Tdr). If the first driving voltage (ELVDD) is transmitted to the driving transistor (Tdr), the light emitting diode emits light, and if the first driving voltage (ELVDD) is blocked, the light emitting diode (ELD) does not emit light. Based on a period in that the emission transistor (Tsw3) is turned on or turned off, luminance of light outputted from the light emitting diode (ELD) may be controlled.

A structure of the pixel driving circuit (PDC) is not limited to a structure shown in FIG. 2 and may be various structures.

Again, referring to FIG. 1, the electroluminescent display device is described.

The data driving circuit 300 converts image data inputted from the controller 400 to analog data voltages (Vdata) and transmits, to data lines (DL1 to DLd), data voltages (Vdata) corresponding to one horizontal line every one horizontal period in that a gate pulse is provided to the gate line (GL). Also, the data driving circuit 300 may transmit an initialization voltage (Vini) or a sensing voltage (Vref) to the sensing transistor (Tsw2). The data driving circuit 300 is driven by the data control signal (DCS) transmitted from the controller 400.

The gate driving circuit 200 is included in the display panel 100 and outputs the gate signals (VGO) to gate lines (GL1 to GLg). The emission driving circuit 500 is included in the display panel 100 and outputs the emission signal (EMO) controlling the emission transistor (Tsw3) to the emission line (EL).

All of the gate signal (VGO), the sensing control signal (SS), and the emission signal (EMO) are configured as the gate on pulse and the gate off pulse and control turn-on and turn-off of the transistor to which each signal is provided. According to an exemplary embodiment of the present disclosure, the transistors of the pixel driving circuit (PDC) is configured by PMOS, the gate on pulse turns on the transistors and the gate off pulse turns off the transistors.

The gate driving circuit 200 and the emission driving circuit 500 are equipped on a chip on film (COF) to be connected to the display panel 100 or may be directly formed at the non-display region 130.

Referring to FIG. 3, the gate driving circuit 200 includes gate stages (Gstage 1 to Gstage g) and each of the gate stages (Gstage 1 to Gstage g) generates gate signals (VGO$_1$ to VGO$_g$). In this case, the gate stages (Gstage 1 to Gstage g) of the gate driving circuit 200 are connected to gate lines (GL1 to GLg) respectively. Gate signals (VGO$_1$ to VGO$_g$) outputted from the gate driving circuit 200 are provided to gate lines (GL1 to GLg) respectively. According to circumstances, gate signals (VGO$_1$ to VGO$_g$) may be used as a signal driving the emission driving circuit 500.

The gate pulse configuring the gate signal (VGO) is transmitted in a predetermined order from the gate stages, and each of gate stages provides a gate pulse to a gate line connected to the gate stage. The gate driving circuit 200 is driven by the gate control signal (GCS) transmitted from the controller 400.

The emission driving circuit 500 includes emission stages (Estage 1 to Estage g), and each of the emission stages (Estage1 to Estage g) generate emission signals (EMO$_1$ to EMO$_g$). In this case, the emission stages (Estage 1 to Estage g) of the emission driving circuit 500 are connected with emission lines (EL1 to ELg) respectively.

The emission pulse configuring the emission signal (EMO) is transmitted from the emission stages in a predetermined order, and each of emission stages provides an emission pulse to an emission line connected with the emission stage. The emission driving circuit 500 uses an emission start signal (EMSS) transmitted from the controller 400 to generate the emission signal (EMO). According to circumstances, emission signals (EMO$_1$ to EMO$_g$) may be used as a signal driving the gate driving circuit 200.

The gate driving circuit 200 and the emission driving circuit 500 may be configured in various forms other than a structure shown in FIG. 3. The gate driving circuit 200 and the emission driving circuit 500 may be formed on a left side, a right side, or both sides of the non-display region 130 of the display panel 100.

In order to generate the emission signal (EMO), the controller 400 generates a gate control signal (GCS) that uses timing signals from an outside system to control the gate driving circuit 200, a data control signal (DSC) for controlling the data driving circuit 300, and an emission start signal (EMSS) for controlling the emission driving circuit 500. After sampling and realigning input image data, the realigned image data is provided to the data driving circuit 300.

Figure 4A:
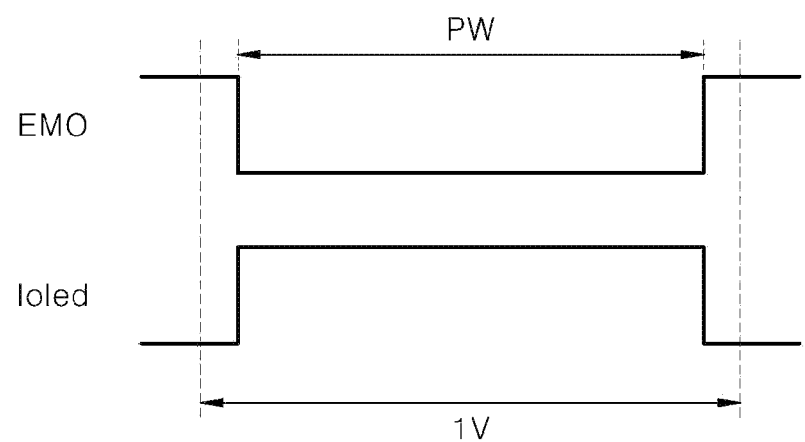
FIG. 4A is a waveform diagram of an emission signal and a driving current according to a luminescent mode of an electroluminescent display device according to one or more embodiments of the present disclosure.
Figure 4A:
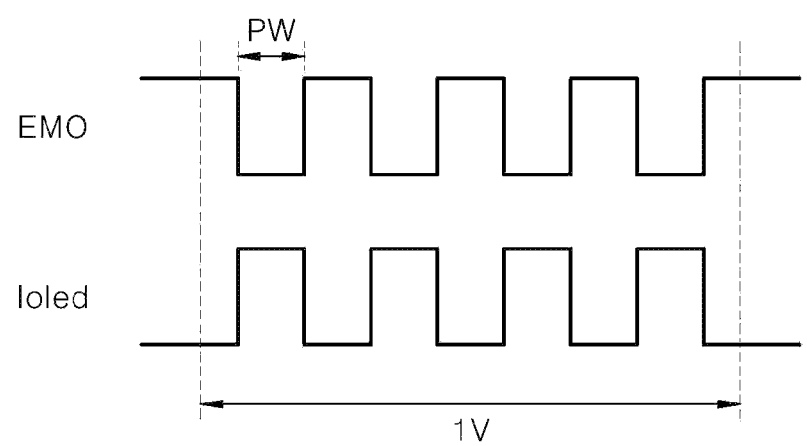

FIG. 4A is a waveform diagram of an emission signal and a driving current according to a luminescent mode of an electroluminescent display device according to one or more embodiments of the present disclosure.

A waveform shown in an upper side of FIG. 4A is the waveform diagram of an emission signal (EMO) and a driving current (Ioled) during one vertical period (1V) in a general driving method. In an emission stage, during one vertical period (1V), the emission signal (EMO) is outputted as a gate on pulse, and during one vertical period (1V), a driving current (Ioled) is provided to the light emitting diode (ELD). Accordingly, the light emitting diode (ELD) continuously emits light during one vertical period (1V). A period in that the emission signal (EMO) is a gate on pulse is referred to as the pulse width of the emission signal and is indicated as the pulse width (PW).

Referring to FIG. 1, one vertical period (1V) may mean a period needed that, for example, in an order in that a gate signal is provided to the first pixel row (Pr1), a gate signal is provided from the first pixel row (Pr1) to the $g^{th}$ pixel row (Prg) that is the last pixel row of the display region 120 to emit light.

The waveform shown in a lower side of FIG. 4A is the waveform of the emission signal (EMO) and the driving current (Ioled) during one vertical period (1V) in that the pulse width modulation driving method is applied. The emission stage turns off the emission transistor periodically during certain period of one vertical period (1V) to express gradation as light emitting time of the light emitting diode (ELD). The pulse width modulation method may be referred to as a duty driving method. Luminance of the display panel 100 to which the duty driving method is applied is determined by a duty ratio. In this case, the duty ratio means a ratio of time, in which the emission transistor is turned on, of the whole light emitting time. The duty ratio of the waveform shown in the lower side of FIG. 4A is 50%. Also, the duty ratio determines luminance of the display panel 100. Even though the display panel 100 is driven in the same duty ratio, in one vertical period (1V), there may be cases such as the case in that the emission signal (EMO) has a gate off pulse and a gate on pulse once respectively, and the case in that the emission signal (EMO) alternatively has the gate off pulse and the gate on pulse four times respectively. All of these two cases have 50% of luminescence and 50% of the same duty ratio compared to the case of emitting the light emitting diode (ELD) throughout one vertical period (1V).

However, in the case in that the emission signal (EMO) has a gate off pulse and a gate on pulse only once respectively, a period in that the light emitting diode (ELD) does not emit light continuously is long, so that display defects such as a flicker may occur. Therefore, the emission signal (EMO) has the regular period and has a gate off pulse and a gate on pulse alternatively to improve defects of the flicker.

A difference of characteristics of the transistor may cause the stain of the display. Particularly, upon expressing low gradation in the display panel 100 of low resolution, visibility of the stain becomes high. Upon expressing low gradation, the driving transistor applies a very small current to the light emitting diode (ELD). A gate-source voltage of the driving transistor in low gradation is smaller than the gate-source voltage of the driving transistor in high gradation. Therefore, even though deviations of currents of the driving transistors are the same with each other, the deviation of the current of the driving transistor occurring in low gradation is consequently larger than that in high gradation. In this case, the pulse width modulation driving reduces a light emitting period and increases a current flowing to the driving transistor to reduce the deviation of the current. Accordingly, the stain occurring in low gradation may be reduced.

Figure 4B:
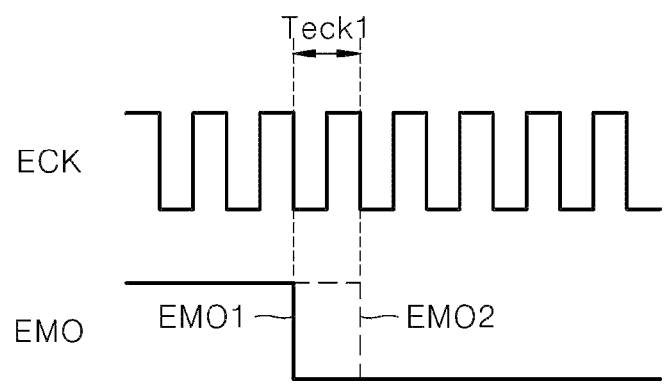
FIG. 4B is a waveform diagram of an emission clock signal and an emission signal according to resolution of an electroluminescent display device according to one or more embodiments of the present disclosure.
Figure 4B:
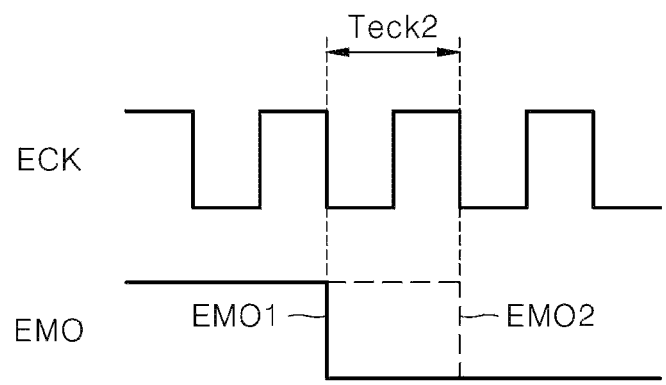

FIG. 4B is a waveform diagram of an emission clock signal and an emission signal according to resolution of an electroluminescent display device according to one or more embodiments of the present disclosure.

A period (Teck1) of the emission clock signal of the upper side of FIG. 4B is smaller than a period (Teck2) of the emission clock signal of the lower side of FIG. 4B. The period of the emission clock signal is affected by resolution of the display panel 100. The period (Teck) of the emission clock signal is determined by equation 1.

$$Teck = \frac{(VT - Vblk)}{Vline} \quad \text{Equation 1}$$

In this case, VT is one frame period, Vblk is a blank period of a vertical period, and Vline is the number of the pixel arranged in a column direction (CD) in the display panel 100. One frame period means a period needed in order that the pixel array within the display region 120 emits light all once. The blank period of the vertical period means a difference of time in that the gate signal is applied every adjacent pixel row. The period (Teck) of the emission clock signal (ECK) is inversely proportional to vertical resolution of the display panel 100. As the number of the pixel arranged vertically in the display panel 100 is many, the period (Teck) of the emission clock signal (ECK) is small. As a result, as the resolution of the display panel 100 is large, the period (Teck) of the emission clock signal (ECK) is small, and as the resolution of the display panel 100 is small, the period (Teck) of the emission clock signal (ECK) is large. Therefore, resolution of the display panel 100 of the upper side figure of FIG. 4B is relatively larger than that of the display panel 100 of the lower side figure of FIG. 4B.

According to the previous description of FIG. 4A, it is noted that as a repetitive period of the gate off pulse and the gate on pulse is short in the emission signal (EMO), visibility of the flicker is low. It means that the pulse width (PW) of the emission signal should be small. The emission signal (EMO) is generated in synchronization with the emission clock signal (ECK), so that it may be understood that in order to make the pulse width (PW) of the emission signal small, the period of the emission clock signal (ECK) should be small.

For example, in the case in that the emission transistor is a PMOS type, the emission signal (EMO) of FIG. 4B shows a part of converting from the gate off pulse to the gate on pulse. Further, the transistors configuring the emission driving circuit 500 are also the PMOS type. The emission signal (EMO) is synchronized in a time point in that the emission clock signal (ECK) converts from the gate off pulse to gate on pulse and is converted from the gate off pulse to gate on pulse. The minimum time difference in that the emission signal (EMO) is converted from the gate off pulse to the gate on pulse may occur by the difference between EMO1 signal and EMO2 signal. The difference between the EMO1 signal and the EMO2 signal in a figure of the upper side of FIG. 4B is smaller than the difference between EMO1 signal and EMO2 signal in the lower side of FIG. 4B. Explaining it again, as the resolution of the display panel 100 is large, the period of the emission clock signal is small. Accordingly, a converting period of the gate off pulse and the gate on pulse of the emission signal that is generated in synchronization with the emission clock signal is shorter. Therefore, even though the display panel 100 corresponding to the waveform of the upper side of FIG. 4B and the lower side of FIG. 4B has the same duty ratio, the pulse width of the emission signal (EMO) of the upper side of FIG. 4B is smaller than that of the emission signal (EMO) of the lower side of FIG. 4B. As the pulse width of emission signal (EMO) becomes smaller (as shown with the waveform of the upper side of FIG. 4B), the number of converting the gate off pulse and the gate on pulse may increase and defects such as the flicker and the stain of low gradation may less occur.

Figure 5:
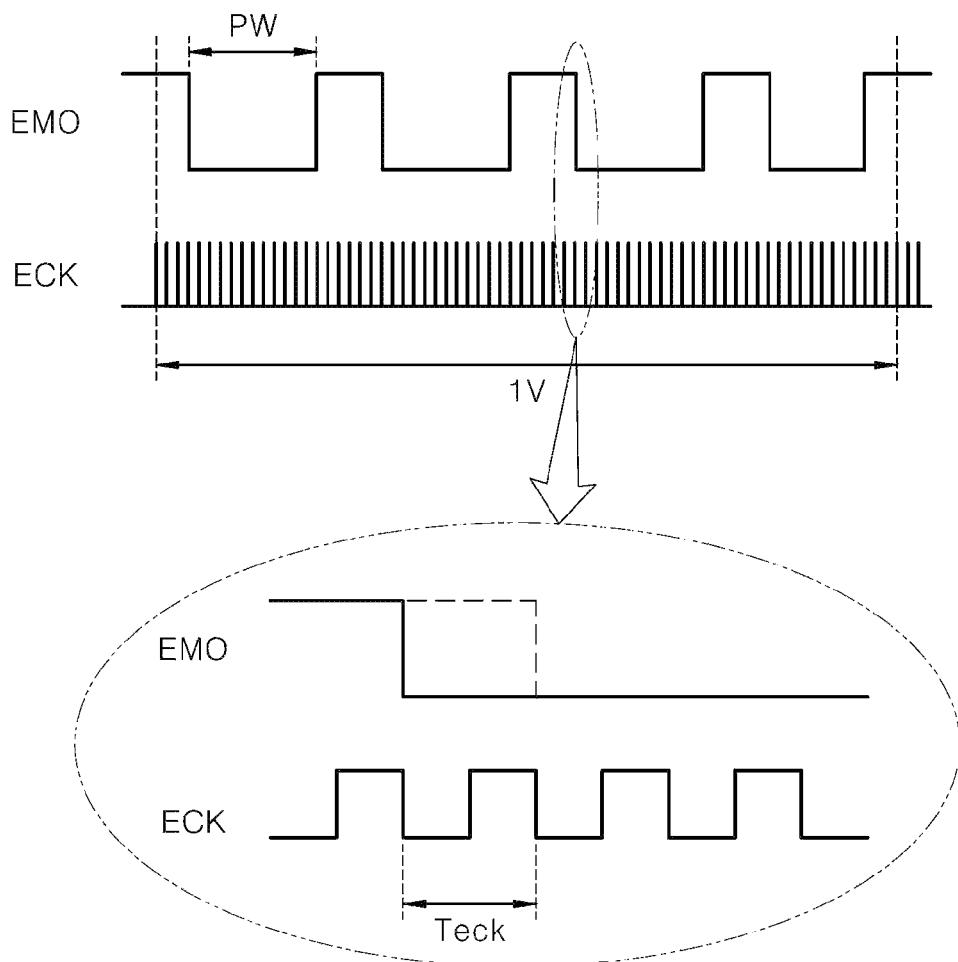
FIG. 5 is a waveform diagram of an emission clock signal and an emission signal according to one or more embodiments of the present disclosure.

FIG. 5 is a waveform diagram of an emission clock signal and an emission signal.

FIG. 5 is the figure showing the emission clock signal (ECK) and the emission signal (EMO) in one vertical period (1V) wherein a ratio of the gate off pulse of the emission signal (EMO) is about 33%, a ratio of the gate on pulse is about 67%, and the duty ratio is about ⅓ as an example. If the duty ratio is close to 1, motion blur may occur. Therefore, the duty ratio is preferably ½ or less.

The display panel 100 driving in duty repeats the flicker based on the duty ratio determined within one frame and the number in that the transistor is turned off. As the period (T) of the emission clock signal is small, the pulse width (PW) modulation of the emission signal may be more precisely regulated and luminance of the display panel 100 may be finely controlled. As a feature of the display panel 100 according to the resolution of the pulse width, the display panel 100 of the high resolution has high pulse width resolution and the display panel 100 of the low resolution has low pulse width resolution. As the pulse width resolution is low, precision for controlling luminance of the display panel 100 is lowered. Particularly, in case that the display panel 100 displays low gradation, precision of the pulse width resolution is more needed. For example, if the display panel 100 having the high pulse width resolution is applied to a mobile phone, the user may control luminance of the display more precisely. If the pulse width resolution is not good, the stain of low gradation may occur.

The pulse width resolution may be enhanced by reducing the period (T) of the emission clock signal. Hereinafter, a method of reducing the period (T) of the emission clock signal is described.

Figure 6A:
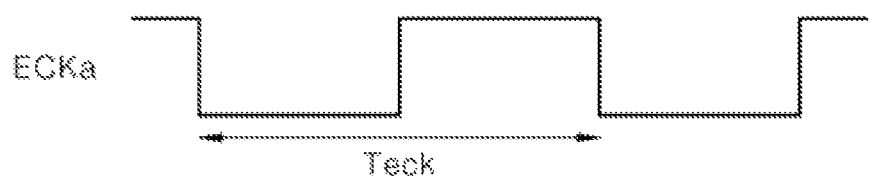
FIG. 6A to 6C are waveform diagrams according to a cycle of an emission clock signal according to one or more embodiments of the present disclosure.
Figure 6B:
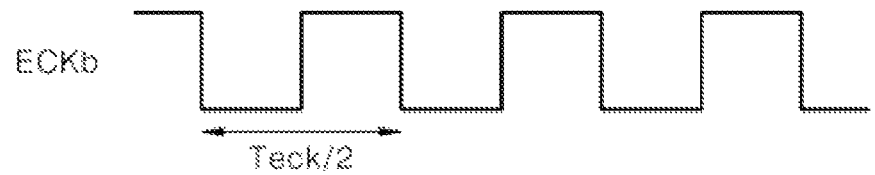
Figure 6C:
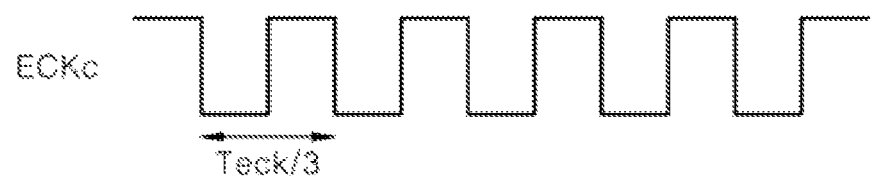

FIG. 6A to FIG. 6C are waveform diagrams according to a cycle of an emission clock signal. In the case of FIG. 6A to 6C, the number of emission lines (EL$_1$ to EL$_g$) are g such as FIG. 1 wherein each of the emission lines (EL$_1$ to EL$_g$) is connected with the pixel row and transmits the emission signal, and the emission lines (EL$_1$ to EL$_g$) match with and are connected with emission stages (Estage 1 to Estage g) by one to one such as FIG. 3.

When a period of the emission clock signal (ECKa) of FIG. 6A is T, the period of the emission clock signal (ECKb) of FIG. 6B is T/2 of the period of the emission clock signal (ECKa) of FIG. 6A, and the period of the emission clock signal (ECKc) of FIG. 6C is T/3 of the period of the emission clock signal (ECKa) of FIG. 6A.

Under assumption in that a frequency of the display panel 100 is the same, the resolution of the display panel 100 of FIG. 6A, FIG. 6B, and FIG. 6C is that FIG. 6A is the lowest, FIG. 6B is higher than FIG. 6A, and FIG. 6C is higher than FIG. 6B. Further, in the same way, FIG. 6A of the pulse width resolution is the lowest and FIG. 6C of the pulse width resolution is the highest. As noted previously, as the resolution of the display panel 100 is high, the period of the emission clock signal (ECK) is reduced. Accordingly, the pulse width resolution may be increased.

FIG. 7A to FIG. 7E are figures, each of the figures illustrating a connection relation between an emission driving circuit 500 and a pixel according to one or more embodiments of the present disclosure. The emission driving circuit 500 is connected with pixels (pixel row) arranged in a row direction (RD) through one emission line, so that each of FIG. 7A to FIG. 7E shows a connection relation between an emission driving circuit 500 and a pixel row. A common features of FIG. 7A to FIG. 7E are that the number of emission stages is more than the number of the pixels (pixel columns) arranged along the column direction (CD) wherein the number of emission stages is two times or more than the number of the pixel columns. In FIG. 7A to FIG. 7E, the case in that one pixel includes a sub-pixel of red (R), green (G), and blue (B) is shown as an example, but the case is not limited to the above. One pixel may include a sub-pixel of white (W) other than red (R), green (G), and blue (B). Also, the case in that the sub-pixel is a stripe type is shown as an example, but the case is not limited to the above. An area may be differently formed according to the light emitting color of the sub-pixel, and the pixel may be configured in a zigzag arrangement or arrangement of various forms. Hereinafter, specific examples about a connection relation of the emission driving circuit 500 and the pixel row are described.

Figure 7A:
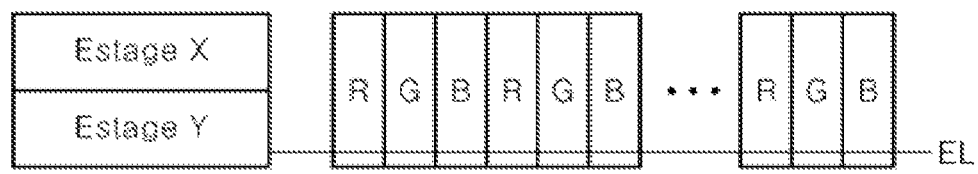
FIG. 7A to 7E are figures, each of the figures illustrating a connection relation between an emission driving circuit and a pixel according to one or more embodiments of the present disclosure.

FIG. 7A is an example in that two emission stages (Estage X, Estage Y) are connected with one pixel row. One pixel row receives the emission signal transmitted through two emission stages (Estage X, Estage Y). X emission stage (Estage X) is connected with Y emission stage (Estage Y). An output signal of the first emission stage (Estage X) is transmitted to the Y emission stage (Estage Y) and the Y emission stage (Estage Y) outputs the emission signal and provides to one pixel row. The emission signal of the Y emission stage (Estage Y) is provided one pixel row through the emission line (EL). Explaining it again, two emission stages (Estage X, Estage Y) provide the emission signal to one pixel row through one emission line (EL).

Figure 7B:
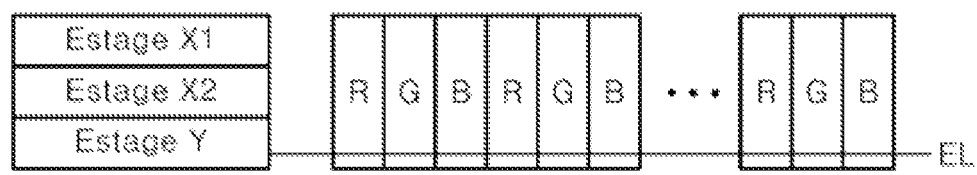

FIG. 7B is an example in that three emission stages (Estage X1, Estage X2, Estage Y) are connected with one pixel row. One pixel row receives the emission signal transmitted through three emission stages (Estage X1, Estage X2, Estage Y). The X1 emission stage (Estage X1) and the X2 emission stage (Estage X2), and the X2 emission stage (Estage X2) and the Y emission stage (Estage Y) are connected with each other respectively. The X1 emission stage (Estage X1) transmits an output signal of the X1 emission stage (Estage X1) to the X2 emission stage (Estage X2), and the X2 emission stage (Estage X2) transmits the output signal of the X2 emission stage (Estage X2) to the Y emission stage (Estage Y), and the Y emission stage (Estage Y) outputs the emission signal to provide to one pixel row. The emission signal of the Y emission stage (Estage Y) is provided to one pixel row through the emission line (EL). Explaining it again, three emission stages (Estage X1, Estage X2, Estage Y) provide the emission signal to one pixel row through one emission line (EL).

Figure 7C:
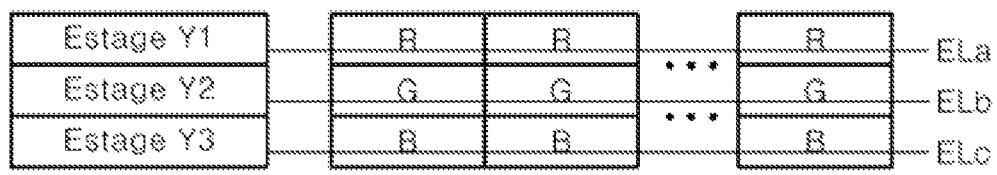

FIG. 7C is a structure in that three sub-pixels of red (R), green (G), and blue (B) configuring one pixel are arranged along the pixel column, and three sub-pixels are connected to three emission stages (Estage Y1, Estage Y2, Estage Y3) respectively. The vertical resolution of the display panel 100 of FIG. 7C is three times the vertical resolution of the display panel 100 of FIG. 7A and FIG. 7B described previously, and the horizontal resolution of the display panel 100 of FIG. 7C is ⅓ of the horizontal resolution of the display panel 100 of FIG. 7A and FIG. 7B described previously. One pixel should include sub-pixels of red (R), green (G), and blue (B), so that the number of emission stages providing the emission signal to one pixel is three wherein the emission stages corresponding to three times the number of pixels arranged in a column direction (CD) to the display panel 100 are arranged in a column direction (CD) to the display panel 100. The sub-pixels emitting the same color is connected with one emission line and receives the emission signal through one emission stage. The Y1 emission stage (Estage Y1) outputs and provides the emission signal to one sub-pixel row emitting red (R) through a emission line (ELa). The Y2 emission stage (Estage Y2) outputs and provides the emission signal to one sub-pixel row emitting green (G) through b emission line (ELb). The Y3 emission stage (Estage Y3) outputs and provides the emission signal to one sub-pixel row emitting blue (B) through c emission line (ELc). Explaining it again, three emission stages (Estage Y1, Estage Y2, Estage Y3) output and provide the emission signal to one pixel through three emission lines (ELa, ELb, ELc) respectively.

Figure 7D:
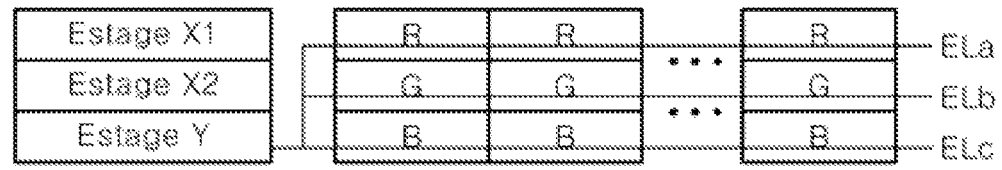

Similar to FIG. 7C, FIG. 7D is an example showing a pixel structure in that three sub-pixels of red (R), green (G), and blue (B) are arranged along the pixel column. The vertical resolution of the display panel 100 of FIG. 7D is three times the vertical resolution of the display panel 100 of FIG. 7A and FIG. 7B described previously and the horizontal resolution of the display panel 100 of FIG. 7D is ⅓ of the horizontal resolution of the display panel 100 of FIG. 7A and FIG. 7B described previously. In FIG. 7D, three emission stages (Estage X1, Estage X2, Estage Y) are connected with three sub-pixel rows. The three sub-pixel rows receives the emission signal transmitted through the three emission stages (Estage X1, Estage X2, Estage Y) respectively. The X1 emission stage (Estage X1) and the X2 emission stage (Estage X2), and the X2 emission stage (Estage X2) and the Y emission stage (Estage Y) are connected with each other respectively. The X1 emission stage (Estage X1) transmits an output signal of the X1 emission stage (Estage X1) to the X2 emission stage (Estage X2), and the X2 emission stage (Estage X2) transmits an output signal of the X2 emission stage (Estage X2) to the Y emission stage (Estage Y), and the Y emission stage (Estage Y) outputs the emission signal to provide to three sub-pixel rows. The emission signal of the Y emission stage (Estage Y) is provided to three sub-pixel rows through three emission lines (ELa, ELb, Elc). Explaining it again, three emission stages (Estage X1, Estage X2, Estage Y) output one emission signal to provide one pixel.

The number of the emission stages connected with one pixel is three, the emission stages corresponding to three times the number of the pixel arranged vertically in the display panel 100 are arranged in a column direction (CD) of the display panel 100. Sub-pixels emitting the same color are connected with one emission line and receive an emission signal through one emission stage. The Y emission stage (Estage Y) outputs and provides the emission signal to one sub-pixel row emitting red (R) through the a emission line (ELa), provides the emission signal to one sub-pixel row emitting green (G) through the b emission line (ELb), and provides the emission signal to one sub-pixel row emitting blue (B) through the c emission line (ELc).

Figure 7E:
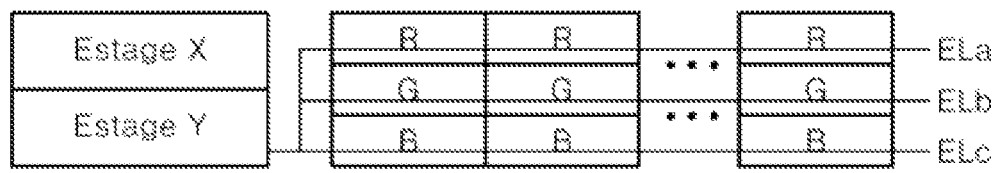

Similar to FIG. 7D, FIG. 7E is an example showing a pixel structure in that three sub-pixels of red (R), green (G), and blue (B) are arranged along the pixel column. The vertical resolution of the display panel 100 of FIG. 7E is three times the vertical resolution of the display panel 100 of FIG. 7A and FIG. 7B described previously and the horizontal resolution of the display panel 100 of FIG. 7E is ⅓ of the horizontal resolution of the display panel 100 of FIG. 7A and FIG. 7B described previously. In FIG. 7E, two emission stages (Estage X, Estage Y) are connected with three sub-pixel rows. Three sub-pixel rows receive the emission signal transmitted through two emission stages (Estage X, Estage Y) respectively. The X emission stage (Estage X) and the Y emission stage (Estage Y) are connected with each other. The X emission stage (Estage X) transmits an output signal of the X emission stage (Estage X) to the Y emission stage (Estage Y), and the Y emission stage (Estage Y) outputs the emission signal to provide to three sub-pixel rows. The emission signal of the Y emission stage (Estage Y) is provided to three sub-pixel rows through three emission lines (ELa, ELb, ELc). Explaining it again, two emission stages (Estage X, Estage Y) output and provide one emission signal to one pixel.

The number of the emission stages connected with one pixel is two, the emission stages corresponding to two times the number of the pixels arranged in the column direction (CD) are vertically arranged in the display panel 100. Sub-pixels emitting the same color are connected with one emission line and receive an emission signal through one emission stage. The Y emission stage (Estage Y) outputs and provides the emission signal to one sub-pixel row emitting red (R) through the a emission line (ELa), provides the emission signal to one sub-pixel row emitting green (G) through the b emission line (ELb), and provides the emission signal to one sub-pixel row emitting blue (B) through the c emission line (ELc).

Five examples shown in FIG. 7A to 7E are configured that the number of the emission stages is more than the number of the pixels arranged in the column direction (CD) wherein the emission signal provided to one pixel row is provided through at least two or more emission stages. Therefore, the period of the emission clock signal and the pulse width of the emission signal are reduced to increase the pulse width resolution of the display panel 100.

Figure 8A:
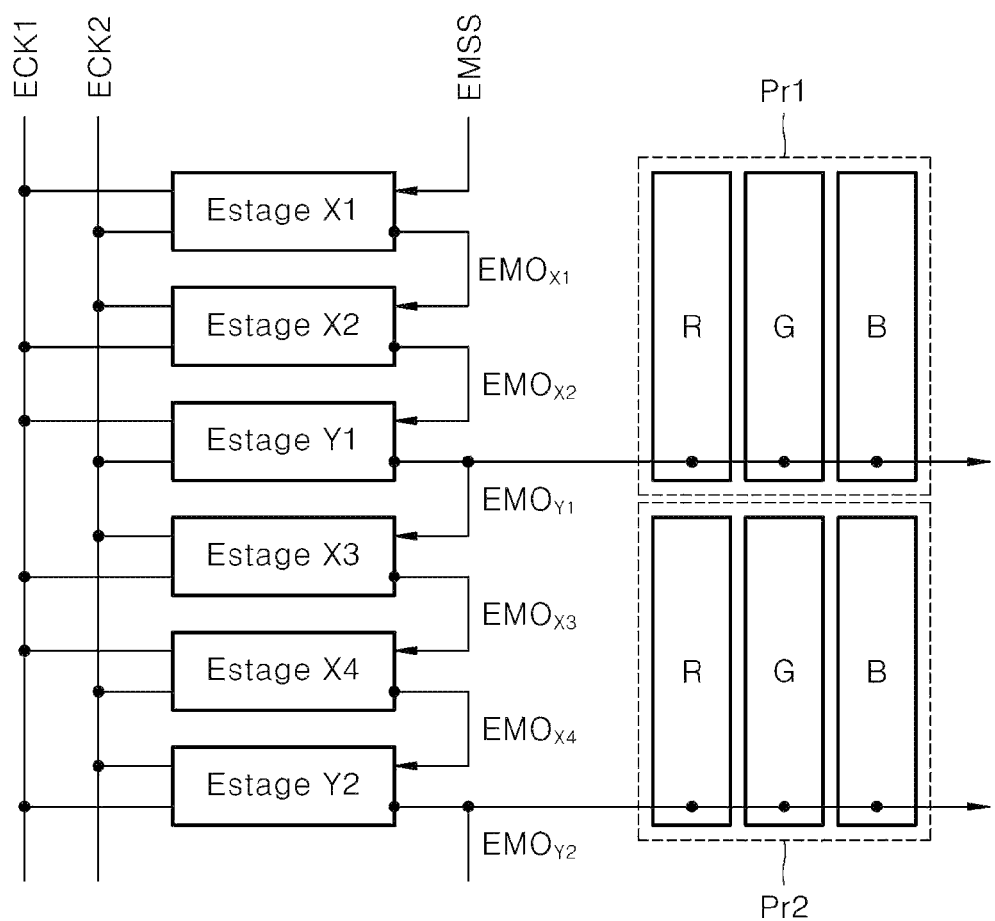
FIGS. 8A and 8B are block diagrams illustrating emission stages configured in the emission driving circuit according to one or more embodiments of the present disclosure.
Figure 8B:
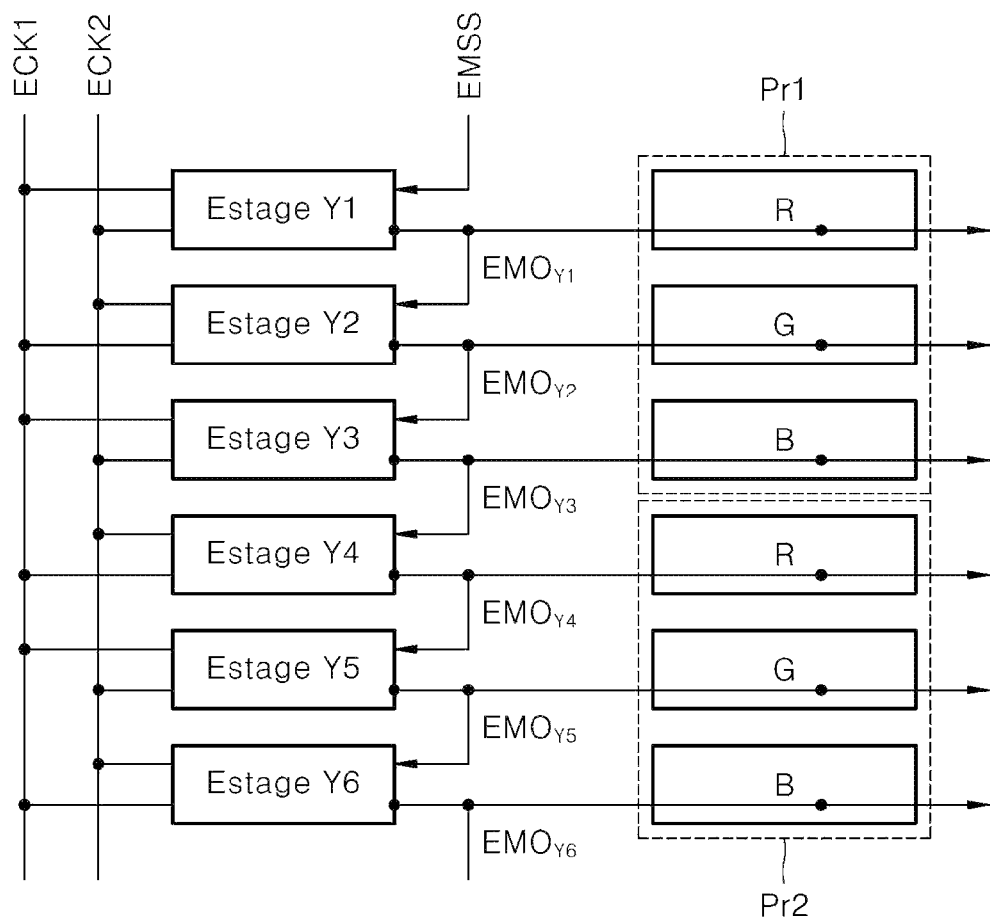

FIGS. 8A and 8B are block diagrams illustrating emission stages configured in the emission driving circuit 500 according to one or more embodiments of the present disclosure.

FIG. 8A is an example illustrating a connection relation of emission stages illustrated in FIG. 7B wherein emission stages for providing the emission signal to the first and second pixel rows (Pr1, Pr2) and the first and second pixel rows (Pr1, Pr2) are shown. A first emission clock signal (ECK1) and a second emission clock signal (ECK2) are provided to the emission driving circuit 500. The first emission clock signal (ECK1) and the second emission clock signal (ECK2) are inputted to each of emission stages. The emission driving circuit 500 includes the emission stages providing the emission signal to the pixels and the emission stages not providing the emission signal to the pixels. Starting from the third emission stage, the emission driving circuit 500 is configured to output the emission signal from the emission stages (i.e., Estage Y1, Estage Y2) corresponding to $[3 \times n]^{th}$ stages such as the third emission stage, the sixth emission stage, and the ninth emission stage (n is a natural number).

The emission start signal (EMSS) is provided to the X1 emission stage (Estage X1) that is the first emission stage. The X1 emission stage (Estage X1) outputs and provides the X1 emission signal (EMO X1) to the X2 emission stage (Estage X2) and the X2 emission stage (Estage X2) outputs and provides the X2 emission signal (EMO X2) to the Y1 emission stage (Estage Y1). Further, the Y1 emission stage (Estage Y1) outputs and provides the Y1 emission signal (EMO Y1) to each of sub-pixels included in the first pixel row (Pr1).

The Y1 emission stage (Estage Y1) also provides the Y1 emission signal (EMO Y1) to the X3 emission stage (Estage X3). The X3 emission stage (Estage X3) outputs and provides the X3 emission signal (EMO X3) to the X4 emission stage (Estage X4), and the X4 emission stage (Estage X4) outputs and provides the X4 emission signal (EMO X4) to the Y2 emission stage (Estage Y2). Further, the Y2 emission stage (Estage Y2) outputs and provides the Y2 emission signal (EMO Y2) to each of sub-pixels included in the second pixel row (Pr2) and the next emission stage.

FIG. 8B is an example illustrating a connection relation of emission stages illustrated in FIG. 7C wherein emission stages for providing the emission signal to the first and second pixel rows (Pr1, Pr2) and the first and second pixel rows (Pr1, Pr2) are shown. Each of pixel rows includes three sub-pixel rows. A first emission clock signal (ECK1) and a second emission clock signal (ECK2) are provided to the emission driving circuit 500. The first emission clock signal (ECK1) and the second emission clock signal (ECK2) are inputted to each of emission stages. All the emission stages included in the emission driving circuit 500 provide the emission signal to the sub-pixel rows.

The emission start signal (EMSS) is provided to the Y1 emission stage (Estage Y1) that is the first emission stage. The Y1 emission stage (Estage Y1) outputs and provides the Y1 emission signal (EMO Y1) to the first sub-pixel row included in the first pixel row (Pr1) and the Y2 emission stage (Estage Y2). The Y2 emission stage (Estage Y2) outputs and provides the Y2 emission signal (EMO Y2) to the second sub-pixel row included in the first pixel row (Pr1) and the Y3 emission stage (Estage Y3). The Y3 emission stage (Estage Y3) outputs and provides the Y3 emission signal (EMO Y3) to the third sub-pixel row included in the first pixel row (Pr1) and the Y4 emission stage (Estage Y4).

Next, the Y4 emission stage (Estage Y4) receiving the Y3 emission signal (EMO Y3) outputs and provides the Y4 emission signal (EMO Y4) to the first sub-pixel row included in the second pixel row (Pr2) and the Y5 emission stage (Estage Y5), the Y5 emission stage (Estage Y5) outputs and provides the Y5 emission signal (EMO Y5) to the second sub-pixel row included in the second pixel row (Pr2) and the Y6 emission stage (Estage Y6), and the Y6 emission stage (Estage Y6) outputs and provides the Y6 emission signal (EMO Y6) to the third sub-pixel row included in the second pixel row (Pr2) and the next emission stage.

Figure 9A:
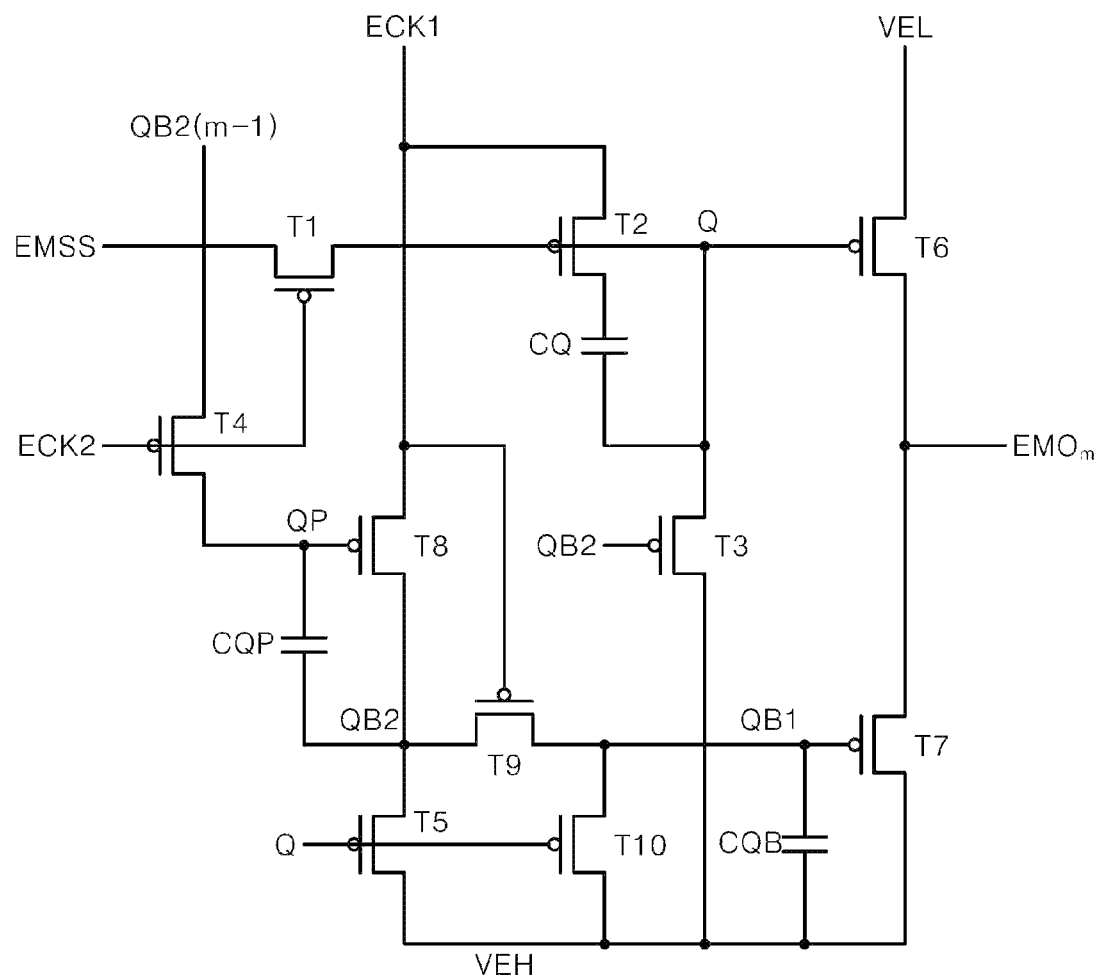
FIG. 9A is a circuit diagram of an emission driving circuit according to one or more embodiments of the present disclosure.
Figure 9B:
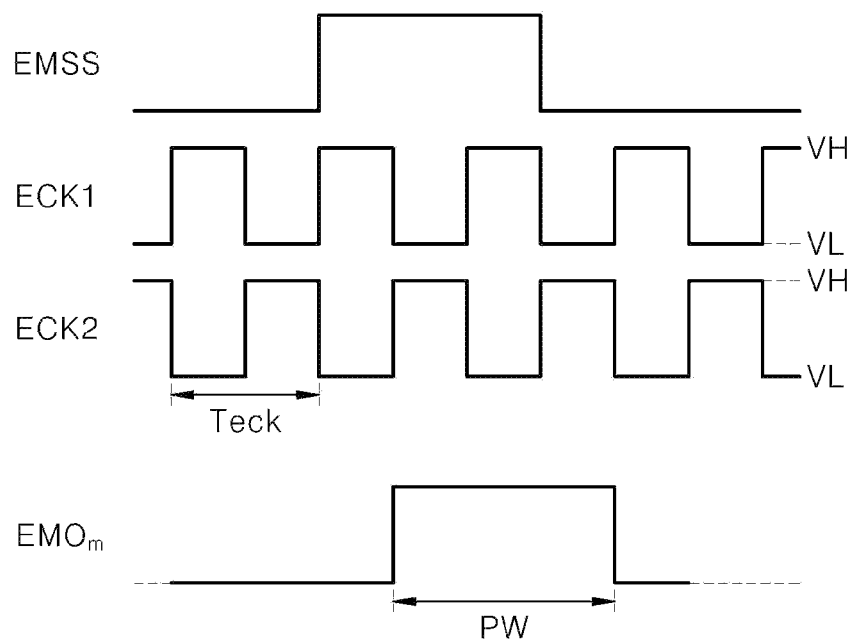
FIG. 9B is a waveform of an input signal and an output signal needed for driving the emission driving circuit of FIG. 9A according to one or more embodiments of the present disclosure.

FIG. 9A is a circuit diagram of an emission driving circuit 500 according to one or more embodiments of the present disclosure. FIG. 9B is a waveform of an input signal and an output signal needed for driving the emission driving circuit 500 of FIG. 9A. Specifically, FIG. 9A explains $m^{th}$ emission stage (Estage m) that is $m^{th}$ stage of a plurality of emission stages configuring the emission driving circuit 500 as an example. The $m^{th}$ emission stage outputs the emission signal ($EMO_m$).

The $m^{th}$ emission stage includes a first transistor (T1), a second transistor (T2), a third transistor (T3), a fourth transistor (T4), a fifth transistor (T5), a sixth transistor (T6), a seventh transistor (T7), a eighth transistor (T8), a ninth transistor (T9), a tenth transistor (T10), a first capacitor (CQ), a second capacitor (CQP), and a third capacitor (CQB).

The first transistor (T1) is controlled by the second emission clock signal (ECK2) and is connected to a line and Q node (Q) to which the emission start signal (EMSS) is applied. The first transistor (T1) is turned on by the second emission clock signal (ECK2). The first transistor (T1) is turned on and transmits the emission start signal (EMSS) to the Q node (Q) wherein the Q node (Q) is charged by the emission start signal (EMSS). In this case, the emission start signal (EMSS) may be the emission signal outputted from $m-1^{th}$ emission stage that is the previous emission stage.

The second transistor (T2) is controlled by the Q node (Q) and is connected to the line to which the first emission clock signal (ECK1) is applied and one end of the first capacitor (CQ). The second transistor (T2) is turned on based on a potential of the Q node (Q). The second transistor (T2) is turned on and transmits the first emission clock signal (ECK1) to one end of the first capacitor (CQ), and the first capacitor (CQ) is charged by a voltage for maintaining the Q node (Q) in a state of a certain potential.

The third transistor (T3) is controlled by the QB2 node (QB2) and is connected to the Q node (Q) and the line to which a high potential voltage (VEH) is applied. The third transistor (T3) is turned on based on the potential of the QB2 node (QB2). The third transistor (T3) is turned on and transmits the high potential voltage (VEH) to the Q node (Q), and the Q node (Q) is discharged by the high potential voltage (VEH).

The fourth transistor (T4) is controlled by the second clock signal (ECK2) and is connected to m-1 QB2 node (QB2(m-1)) and QP node (QP). The fourth transistor (T4) is turned based on the second clock signal (ECK2). The fourth transistor (T4) is turned on and transmits a voltage of m-1 QB2 node (QB2(m-1)) to the QP node (QP). In this case, the m-1 QB2 node (QB2(m-1)) is the QB2 node included in m-1 emission stage providing the emission signal to $m-1^{th}$ pixel row.

The fifth transistor (T5) is controlled by the Q node (Q) and is connected to the QB2 node (QB2) and the line to which the high potential voltage (VEH) is applied. The fifth transistor (T5) is turned on based on the potential of the Q node (Q). The fifth transistor (T5) is turned on and transmits the high potential voltage (VEH) to the QB2 node (QB2). In this case, the QB2 node (QB2) is discharged by the high potential voltage (VEH).

The sixth transistor (T6) is controlled by the Q node (Q) and is connected to the line to which a low potential voltage (VEL) is applied and the emission line which outputs the emission signal ($EMO_m$). The sixth transistor (T6) is turned on based on the potential of the Q node (Q). The sixth transistor (T6) is turned on to output the low potential voltage (VEL) to the emission line. In this case, $m^{th}$ emission stage outputs the emission signal of the low potential voltage (VEL). The outputted emission signal ($EMO_m$) may be provided to $m^{th}$ pixel row (Prm) or may be provided to m+1 emission stage that is the next stage as the input signal.

The seventh transistor (T7) is controlled by the QB1 node (QB1) and is connected to the line to which the high potential voltage (VEH) is applied and the emission line which outputs the emission signal ($EMO_m$). The seventh transistor (T7) is turned on based on the potential of the QB1 node (QB1). The seventh transistor (T7) is turned on to output the high potential voltage (VEH) to the emission line. In this case, the $m^{th}$ emission stage outputs the emission signal of the high potential voltage (VEH). The outputted emission signal ($EMO_m$) may be provided to the $m^{th}$ pixel row (Prm) or may be provided to the m+1 emission stage that is the next stage as the input signal.

The eighth transistor (T8) is controlled by the QP node (QP) and is connected to the line to which the first clock signal (ECK1) is applied and the QB2 node (QB2). The eighth transistor (T8) is turned on based on the potential of the QP node (QP). The eighth transistor (T8) is turned on based on the potential of the QP node (QP). The eighth transistor (T8) is turned on and provides the first clock signal (ECK1) to the QB2 node (QB2).

The ninth transistor (T9) is controlled by the first clock signal (ECK1) and is connected to the QB2 node (QB2) and the QB1 node (QB1). The ninth transistor (T9) is turned on based on the first clock signal (ECK1). The ninth transistor (T9) is turned on and makes the QB2 node (QB2) and the QB1 node (QB1) be in a continuity state. In this case, the QB1 node (QB1) is affected by the potential formed in the QB2 node (QB2).

The tenth transistor (T10) is controlled by the Q node (Q) and is connected to the QB1 node (QB1) and the line to which the high potential voltage (VEH) is applied. The tenth transistor (T10) is turned on based on the potential of the Q node (Q). The tenth transistor (T10) is turned on and provides the high potential voltage (VEH) to the QB1 node (QB1). In this case, the QB1 node (QB1) is charged by the high potential voltage (VEH).

The first capacitor (CQ) is connected to the second transistor (T2) and the Q node (Q). The first capacitor (CQ) has a role of maintaining the potential of the Q node (Q) in a logic high (VH) after the emission signal ($EMO_m$) of the low potential voltage (VEL) is outputted.

The second capacitor (CQP) is connected to the QP node (QP) and the QB2 node (QB2). The second capacitor (CQP) has a role of maintaining the potential of a logic low (VL) of the first clock signal (ECK1) in a low state based on the potential of m−1 QB2 node ($QB2(m-1)$). The logic low (VL) may be a voltage turning on the transistor or the low potential voltage. The first clock signal (ECK1) and the second clock signal (ECK2) is the signal which has the period (T) and to which the pulse of the logic low (VL) and the logic high (VH) is provided alternatively.

The third capacitor (CQB) is connected with the QB1 node (QB1) and the line to which the high potential voltage (VEH) is applied. The third capacitor (CQB) has a role of maintaining the potential of the QB1 node (QB1) in a logic high after the emission signal ($EMO_m$) of the high potential voltage (VEH) is outputted.

The emission driving circuit 500 according to one or more embodiments of the present disclosure moves the potential of m−1 QB2 node ($QB2(m-1)$) such as the shift register and apply it to the QB2 node (QB2), and is configured to output the logic high through the seventh transistor (T7) based on the potential of the QB1 node (QB1).

The emission driving circuit 500 according to one or more embodiments of the present disclosure outputs the emission signal in that the pulse width (PW) is 3/2T through the emission clock signals (ECK1, ECK2) in that the period is T. The plurality of emission stages configuring the emission driving circuit 500 output the emission signal in that the pulse width (PW) is 3/2T based on the period of T successively.

The electroluminescent display panel 100 including the pixel driving circuit according to one or more embodiments of the present disclosure may be described as follows.

According to one or more embodiments of the present disclosure, the electroluminescent display panel 100 may include a plurality of pixels arranged along a row direction and a column direction, an emission line transmitting an emission signal to the plurality of pixels arranged along the row direction, and an emission driving circuit 500 providing an emission signal to the plurality of pixels. The emission driving circuit 500 includes a plurality of emission stages wherein the number of emission stages is more than the number of the plurality of pixels arranged along the column direction. Therefore, the pulse width resolution of the display panel 100 may be enhanced and the low gradation stain may be reduced.

According to one or more embodiments of the present disclosure, each of the plurality of pixels comprises a pixel driving circuit and a light emitting diode, the pixel driving circuit comprises an emission transistor controlling whether the light emitting diode emits light, and a gate electrode of the emission transistor may be connected to the emission line.

According to one or more embodiments of the present disclosure, a plurality of emission lines are arranged to correspond to the plurality of pixels arranged along the column direction, and the number of the plurality of emission stages is two times or more than the number of emission lines.

According to one or more embodiments of the present disclosure, the plurality of emission stages include the emission stages connected to the emission line and the emission stages not connected to the emission line. An output signal of the emission stages not connected to the emission line may be provided as an input signal of the emission stage disposed at the next row of the emission stage outputting the output signal.

According to one or more embodiments of the present disclosure, the emission signal includes a gate on pulse which turns on the emission transistor, and the pulse width of the gate on pulse of the emission signal is smaller than the pulse width of the emission signal provided to the plurality of pixels when the number of the plurality of emission stages is the same as the number of the plurality of pixels arranged along the column direction.

According to one or more embodiments of the present disclosure, each of the plurality of pixels includes a plurality of sub-pixels arranged along the column direction, and the emission line is connected to a sub-pixel row including any one sub-pixel of the plurality of sub-pixels. The emission line may be connected to all of a plurality of sub-pixel rows including each of the plurality of sub-pixels.

According to one or more embodiments of embodiments of the present disclosure, a pixel array made of a pixel column and a pixel row, a controller 400, and an emission driving circuit 500 including a plurality of emission stages, wherein the controller 400 provides a control signal controlling the emission driving circuit 500, the pixel array includes a plurality of pixels. Each of the plurality of pixels includes a light emitting diode, a driving transistor providing a driving current to the light emitting diode, and an emission transistor controlling that the driving current is applied to the light emitting diode. Here, the emission transistor is controlled by an emission signal provided by the emission driving circuit 500, the emission signal occurs based on an emission clock signal provided by the controller 400, and during one vertical period, a gate on pulse and a gate off pulse are repeated at least once respectively. Here, a cycle of the emission clock signal is smaller than (one frame period-a blank period of a vertical period)/the number of pixels included in the pixel column. Therefore, the pulse width resolution of the display panel 100 may be enhanced and the low gradation stain may be reduced.

According to one or more embodiments of the present disclosure, the number of pixels included in the pixel column may be smaller than the number of the plurality of emission stages.

According to one or more embodiments of the present disclosure, the pixel array further includes a plurality of data lines, a plurality of gate lines, and a plurality of emission lines, and the plurality of pixels connected to each of the plurality of emission lines may emit the same color. The plurality of pixels include n sub-pixels respectively, and the number of emission stages connected through the emission line to any one pixel of the plurality of pixels is more than one and is smaller than or equal to n (n is a natural number). Also, the plurality of emission stages may include the emission stages not connected to the emission line.

According to one or more embodiments of the present disclosure, the emission signal is synchronized with the emission clock signal to determine the pulse width of the emission signal, and, a minimum pulse width of the emission signal may be determined by a cycle of the emission clock signal.

According to one or more embodiments of the present disclosure, the emission driving circuit 500 is operated in a pulse width modulation driving method to turn off the emission transistor periodically.

As the above, exemplary embodiments of the present disclosure were described referring to the attached drawings, but the present disclosure is not limited by the disclosed embodiments and various modifications may be made by one having ordinary skill in the art within the scope of the technical spirit of the disclosure. Therefore, embodiments disclosed in the present disclosure are not for limiting but for describing the technical spirit of the present disclosure, so that the scope of the technical spirit of the present disclosure is not limited by the above embodiments. Therefore, it should be understood that embodiments described above are exemplary in all aspects and do not limit the present disclosure. The protection range of the present disclosure should be interpreted by the scope of claims and it should be understood that all the technical spirits within the equivalent range are included in the right range of the present disclosure.

DESCRIPTION OF SYMBOLS

100: Display panel
120: Display region
130: Non-display region
200: Gate driving circuit
300: Data driving circuit
400: Controller
500: Emission driving circuit The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display panel, comprising:
a plurality of pixels arranged along a row direction and a column direction, each of the plurality of pixels including a first sub-pixel of a first color, a second sub-pixel of a second color, and a third sub-pixel of a third color;
a first emission line that, in operation, transmits an emission signal to the first sub-pixels of a first row of pixels of the plurality of pixels that are arranged along the row direction; and
a plurality of emission stages including a first set of emission stages that is connected to the first emission line and a second set of emission stages that is not connected to the first emission line and is connected to a next emission line of a next stage, the plurality of emission stages being arranged in a column direction of the display panel;
wherein a number of the plurality of emission stages is greater than or equal to twice a number of the plurality of pixels arranged along the column direction, and
wherein two emission stages of the first set of emission stages are connected with three sub-pixel rows.

2. The electroluminescent display panel of claim 1,
wherein each of the plurality of pixels includes a pixel driving circuit and a light emitting diode,
the pixel driving circuit includes an emission transistor that controls a light emitted from the light emitting diode, and
a gate electrode of the emission transistor is connected to a respective emission line.

3. The electroluminescent display panel of claim 1, including:
a plurality of emission lines that are arranged to correspond to the plurality of pixels arranged along the column direction, and
the number of the plurality of emission stages is two or more times a number of the plurality of emission lines.

4. The electroluminescent display panel of claim 1, further comprising:
a second emission line that, in operation, transmits a second emission signal to the second sub-pixels of the first row of pixels of the plurality of pixels that are arranged along the row direction; and
a third emission line that, in operation, transmits a third emission signal to the third sub-pixels of the first row of pixels of the plurality of pixels that are arranged along the row direction;
wherein the first set of emission stages is connected to the second and third emission lines.

5. The electroluminescent display panel of claim 4,
wherein an output signal from each of the second set of emission stages is provided as an input signal to one of the emission stages that is disposed at a next row of the each of the emission stages outputting the output signal.

6. The electroluminescent display panel of claim 4,
wherein the emission signal includes a gate on pulse which turns on an emission transistor, and
a pulse width for the gate on pulse in the emission signal is less than a pulse width of the emission signal provided to the plurality of pixels when the number of the plurality of emission stages and the number of the plurality of pixels arranged along the column direction are the same.

7. The electroluminescent display panel of claim 4,
wherein the first set of emission stages includes:
a first emission stage connected to the first emission line;
a second emission stage connected to the second emission line; and
a third emission stage connected to the third emission line.

8. The electroluminescent display panel of claim 4,
wherein the first set of emission stages includes:

a first emission stage connected to the first emission line, the second emission line and the third emission line; and a second emission stage connected to the first emission stage.

9. The electroluminescent display panel of claim 1, further comprising a controller that, in operation, provides a control signal that controls an emission driving circuit, wherein each of the plurality of pixels includes:

a light emitting diode;

a driving transistor that, in operation, provides a driving current to the light emitting diode; and an emission transistor that, in operation, controls the driving current to the light emitting diode and is controlled based on an emission signal that occurs based on an emission clock signal from the controller and includes a gate on pulse and a gate off pulse which are repeated at least once in one vertical period, and a cycle for the emission clock signal is smaller than (one frame period–a blank period of a vertical period)/a number of pixels included in the pixel column.

10. The electroluminescent display panel of claim 1, wherein the plurality of emission stages includes the emission stages that are not connected to the emission line.

11. The electroluminescent display panel of claim 9, wherein the emission signal is synchronized with the emission clock signal to determine a pulse width of the emission signal, and wherein a minimum pulse width of the emission signal is determined based on the cycle of the emission clock signal.

12. The electroluminescent display panel of claim 9, wherein the plurality of emission stages are operated in a pulse width modulation driving method to turn off the emission transistor periodically.

13. The electroluminescent display panel of claim 1, wherein at least two emission stages among the plurality of emission stages are connected with three pixel rows that, in operation, receive the emission signal transmitted through the at least two emission stages, respectively.

14. A display device, comprising:

a gate driving circuit; and a display panel electrically connected to the gate driving circuit, the display panel including:

a plurality of pixels;

a first emission line that, in operation, transmits a first emission signal to a first row of first sub-pixels of the plurality of pixels, the first sub-pixels being a first color;

a second emission line that, in operation, transmits a second emission signal to a second row of second sub-pixels of the plurality of pixels, the second sub-pixels being a second color;

a third emission line that, in operation, transmits a third emission signal to a third row of third sub-pixels of the plurality of pixels, the third sub-pixels being a third color; and a plurality of emission stages including a first set of emission stages, the first set of emission stages including a first emission stage and a second emission stage that are connected with the first, second and third emission lines, a number of the plurality of emission stages being greater than or equal to two-thirds a vertical resolution of the display panel, the plurality of emission stages being arranged in a vertical direction of the display panel.

15. The display device of claim 14, wherein the first emission stage is connected to the first emission line, the second emission stage is connected to the second emission line; and the first set of emission stages further includes a third emission stage connected to the third emission line.

16. The display device of claim 14, wherein the first set of emission stages further includes a third emission stage, the first emission stage is connected to the first emission line, the second emission line and the third emission line, the second emission stage is connected to the first emission stage, and the third emission stage is connected to the second emission stage.

17. The display device of claim 14, wherein the first emission stage is connected to the first emission line, the second emission line and the third emission line, and the second emission stage is connected to the first emission stage.

* * * * *